United States Patent [19]
Sterling

[11] Patent Number: 5,297,001
[45] Date of Patent: Mar. 22, 1994

[54] HIGH POWER SEMICONDUCTOR ASSEMBLY

[75] Inventor: Robert J. Sterling, Rockton, Ill.

[73] Assignee: Sundstrand Corporation, Rockford, Ill.

[21] Appl. No.: 958,154

[22] Filed: Oct. 8, 1992

[51] Int. Cl.⁵ .................................. H05K 7/20
[52] U.S. Cl. .......................... 361/717; 257/717; 361/736
[58] Field of Search .............. 165/80.3, 185; 257/705-707, 709, 712, 713, 717; 174/16.3, 252, 52.4; 361/382, 383, 386-389, 395

[56] References Cited

U.S. PATENT DOCUMENTS

| | | | |
|---|---|---|---|
| 3,716,759 | 2/1973 | Scace | 361/386 |
| 4,646,129 | 2/1987 | Yerman et al. | 357/74 |
| 4,677,741 | 7/1987 | Takahama | 29/588 |
| 4,680,618 | 7/1987 | Kuroda et al. | 357/74 |
| 4,748,103 | 5/1988 | Hollinger | 430/314 |
| 5,126,827 | 6/1992 | Frank | 257/717 |
| 5,199,164 | 4/1993 | Kim | 29/840 |
| 5,200,641 | 4/1993 | Kosaki | 361/388 |
| 5,204,804 | 4/1993 | Bailey | 361/386 |

Primary Examiner—Gerald P. Tolin
Attorney, Agent, or Firm—Antonelli, Terry, Stout & Kraus

[57] ABSTRACT

An insulated gate bipolar transistor assembly (10) in accordance with the invention includes an insulated gate bipolar transistor die (32) having gate, at least one emitter and collector electrodes and first and second opposed surfaces; a heat conductive electrically insulative substrate (30) thermally coupled to the first surface for conducting heat away from the first surface of the die and having contacts for conducting electric current between the gate electrode and a gate terminal (16) and a collector electrode and a collector terminal (18) of the assembly; a first heat radiator (12) thermally coupled to the substrate for radiating heat flowing from the first surface of the die through the heat conductive insulative substrate; a heat conductive electrical insulator (46) having first and second surfaces with the first surface being thermally coupled to the second surface of the die and a plurality of apertures (51) aligned with the emitter electrode (44) of the die; an emitter contact (52) disposed on the second surface of the heat conductive insulator having a plurality of spring contacts (54) extending through the apertures of the insulator for conducting electric current between the emitter electrode and an emitter terminal of the assembly; and a second heat radiator (62) which is electrically insulative and thermally coupled to the emitter contact for radiating heat flowing from the second surface of the die through the emitter contact.

32 Claims, 4 Drawing Sheets

HIGH POWER SEMICONDUCTOR ASSEMBLY

TECHNICAL FIELD

The present invention relates to power semiconductor switch assemblies for switching high currents, such as several hundred amperes, and, more particularly, to insulated gate bipolar transistor (IGBT) assemblies.

BACKGROUND ART

The IGBT is a high power switch having an insulated gate for controlling the conductivity states of a bipolar transistor. The IGBT has diverse applications for switching high amperage currents flowing between a power supply and an electric load. The Assignee of the present invention has developed VSCF (variable speed constant frequency) electric power generating systems for use in airframes which generate three phase 400 Hz. current with the use of a three phase inverter having IGBT power switches. The IGBTs in a VSCF electric power generating system are configured in a three phase inverter which are switched between on and off states to generate three phase displaced squarewaves occurring at the fundamental frequency of 400 Hz. which are phase displaced by 120°. The DC electric power for generating the inverter is produced by three phase rectification of a three phase alternator which is driven from a power takeoff from a propulsion engine of the airframe or a power unit such as an APU.

It is highly desirable that the three phase inverter utilizing IGBTs in a VSCF electric power generating system have the highest possible current switching power rating and the highest possible reliability. Current designs of IGBTs are limited by the temperature of operation. An IGBT assembly in a three phase inverter used in a VSCF system must be able to withstand repeated thermal cycling which stresses the assembly with a high rate of thermal expansion caused by the repeated heating and cooling of the assembly during operation.

Current designs of IGBTs utilized in three phase inverters in VSCF systems dissipate the heat of switching through the bottom of the case of the IGBT assembly and semiconductor die through a heat radiator which may be a heat sink such as a copper molybdenum base plate. The base plate is thermally coupled to a beryllium oxide substrate which has a high thermal conductivity and which is electrically insulative on which IGBT semiconductor die is mounted. The power rating of the IGBT is limited by the thermal conductivity between the IGBT die and the beryllium oxide substrate and copper molybdenum base. The current designs of IGBTs are limited in power by not dissipating substantial heat through the top surface of the assembly.

Compression bonded bipolar power transistor assemblies utilize heat radiators which radiate heat from the top and bottom of the assembly.

Current IGBTs rely upon wire bonds between electrode terminals and the electrodes of the IGBT and/or metallization between the electrode terminal and the electrode which is disposed on the surface of the beryllium oxide. In current designs of the IGBT, such as those manufactured by Advanced Power Technology, a wire bond is utilized between a gate terminal and the gate electrode of the IGBT die. Current designs of IGBTs also use metallization disposed on the surface of the beryllium oxide substrate between the collector electrode of the semiconductor die and a collector terminal which is soldered to the beryllium oxide substrate at the point of attachment to metallization running to the collector electrode. Current designs of IGBTs also electrically connect the emitter terminal to the emitter electrode with wire bonds.

The use of wire bonds in IGBTs creates reliability problems for high power applications when large currents flow through the wire bonds between external assembly terminals and internal power electrodes such as the emitter. The use of a wire bond to complete the electrical connection between the emitter terminal of a IGBT housing and the emitter electrode creates reliability problems which are caused by excessive heat or strain produced by high current flow. Excessive emitter current can result in the wire bond fusing which creates a high resistance contact. Additionally, the repeated thermal cycling caused by the turning on and off of IGBTs in a three phase inverter such as in a VSCF electric power generating system produces severe thermal stress which can cause a strain induced failure of the wire bond.

U.S. Pat. No. 4,677,741 discloses a method of manufacturing a package for a high power integrated circuit. The '741 patent discloses the use of wire bonds to connect external electrodes to power electrodes of the semiconductor chip.

U.S. Pat. No. 4,748,103 which is assigned to Advanced Power Technology, discloses a IGBT of the type which has been utilized by the Assignee in VSCF electric power generating systems.

DISCLOSURE OF INVENTION

The present invention is an improved power semiconductor switch assembly which preferably is an assembly of an insulated gate bipolar transistor (IGBT). The present invention provides an improved IGBT assembly which provides improved heat dissipating capability for power generated by the semiconductor die during switching and further provides improved reliability resultant from eliminating a wire bond to electrically connect an external terminal to a power electrode of the power switch which in the IGBT is the emitter. The elimination of the emitter wire bond prevents failure of the emitter circuit between emitter terminal and the external emitter electrode caused by stress produced by thermal cycling and further eliminates fusing of the wire bond caused by high current flow between the external emitter terminal and the emitter electrode.

The IGBT of the present invention utilizes an emitter contact having at least one and preferably a plurality of spring contacts which extend through apertures of a heat conductive electrically insulative heat spreader or insulator is disposed on a surface of IGBT semiconductor die to which electrical contact is made between an external emitter terminal and the emitter electrodes on the surface of the IGBT die on which the insulative spreader is disposed. The spring contacts permit thermal expansion and contraction produced by thermal cycling to occur without electrical discontinuity occurring between the emitter contact and the emitter electrodes of the IGBT die. As the materials of the assembly expand and contract as a consequence of changes in temperature, the elastic deformation of the spring contacts maintains continued electrical conductivity between the springs and the emitter electrode(s) on which the springs ride under a spring bias caused by elastic deformation of the springs which does not change regardless of expansion or contraction of the assembly.

The present invention provides an improved electrical connection between external electrical terminals of the assembly and the IGBT electrodes. The emitter contact further efficiently thermally conducts heat from the IGBT die upward to a second heat radiator which is electrically insulative through which electrical connections are made to the gate, emitter, emitter sense terminal and collector terminals of the IGBT. The second heat radiator provides enhanced heat dissipation capability as compared with IGBT assemblies which only conduct heat through the bottom of the assembly which permits higher power to be switched by the IGBT assembly. A collector spring is physically disposed between the metallization on the beryllium oxide substrate and the external collector terminal and is electrically connected in the conductive path between the collector terminal and the collector electrode to provide continued electrical contact between the collector terminal and the collector electrode during thermal cycling. An emitter contact plate and a collector contact plate, which are preferably molybdenum, are respectively disposed between the emitter contact having a plurality of contact springs and the collector contact spring and are hermetically sealed to the second heat radiator.

The assembly is hermetically sealed by providing a seal ring which is joined to the first heat radiator and to the second heat radiator. The seal ring loads the opposed surfaces of the semiconductor die in compression to promote heat flow from the first and second surfaces of the die respectively to the first and second heat radiators. The seal ring has a first end having a section which extends radially inward from an outside diameter of the second radiator and is joined to the first radiator, a second end having a section which extends radially inward from the outside diameter of the second radiator and is joined to the second radiator and a thermal expansion joint contained within the ring.

The present invention has the following functional features. Compensation for thermal expansion induced stress in all planes is provided by utilizinq the spring sections within the electrode contacts and low coefficient of thermal expansion (CTE) materials. The assembly can be electrically tested prior to final sealing and soldering to identify and eliminate defects and reduce wasted material. The invention provides both cooling through upper and lower surfaces of the assembly for removal of waste heat. When used with solid copper power terminals for the power electrodes, currents up to 300 amps for low resistance in power paths at less than 2,300 A/In$^2$ (>434 cir mil per amp) are produced. Terminations through the electrically insulative second heat radiator which is preferably ceramic, such as aluminum oxide ($Al_2O_3$), eliminate eddy currents and induction losses in the housing. Current densities in the semiconductor die power contacts are reduced by providing short electrical paths and an increased area of attachment consequent from the elimination of wire bonds, such as in between the emitter terminal and the emitter electrode. The base of the assembly, which is the first heat radiator, can be incorporated with an integral heat exchanger for high power or high temperature operation including fluid cooling and high surface heat exchange structures such as CHIC structures which are known in the art. The semiconductor die is electrically isolated from structure used for mounting the assembly. The spring contacts perform the dual function of providing a high continuity electrical contact between external power terminals and power electrodes of the semiconductor die and further provide a high thermal conductivity path between the semiconductor die or the substrate to the second heat radiator.

An insulated gate bipolar transistor assembly in accordance with the present invention includes an insulated gate bipolar transistor die having a gate, at least one emitter and collector electrodes and first and second opposed surfaces; a heat conductive electrically insulative substrate thermally coupled to the first surface for conducting heat away from the first surface of the die and having conductors on the surface of the substrate for conducting electric current between the gate electrode and a gate terminal and a collector electrode and a collector terminal of the assembly; a first heat radiator thermally coupled to the substrate for radiating heat flowing from the first surface of the die through the heat conductive insulative substrate; a heat conductive electrical insulator having first and second surfaces with the first surface being thermally coupled to the second surface of the die and at least one aperture aligned with the at least one emitter electrode of the die; an emitter contact disposed on the second surface of the insulator having at least one spring contact respectively extending through the at least one aperture of the insulator for conducting electric current between the at least one emitter electrode and an emitter terminal of the assembly; and a second heat radiator which is electrically insulative and thermally coupled to the emitter contact for radiating heat flowing from the second surface of the die through the emitter contact. The assembly further includes a thermally and electrically conductive emitter contact plate having a first surface electrically and thermally contacting the emitter contact and a second surface electrically and thermally contacting the emitter terminal and thermally contacting the second heat radiator with the emitter terminal extending through an aperture in the second heat radiator. The assembly further includes a collector contact spring electrically coupled to the conductor of the heat conductive electrically insulative substrate through which current flows between the collector electrode and the collector terminal and electrically coupled to the collector terminal which extends through an aperture in the second heat radiator.

A seal ring is joined to the first heat radiator and the second heat radiator which forms a hermetic seal and which loads the first and second surfaces of the die in compression to promote heat flow from the first and second surfaces of the die respectively to the first and second heat radiators. The seal ring includes a first end having a section which extends radially inward from an outside diameter of the second radiator and is joined to the first radiator, a second end having a section which extends radially inward from the outside diameter of the second radiator and is joined to the second heat radiator and a thermal expansion joint contained within the ring.

A gate terminal extends through an aperture in the second heat radiator to the conductor for conducting electric current between the gate electrode and the gate terminal and an emitter sense terminal extends through an aperture in the second heat radiator into electrical contact with the emitter contact.

At least one projection projects upward from the second heat radiator between an emitter terminal extending through the second heat radiator and a gate terminal extending through the second heat radiator with the at least one projection radiating heat and providing a barrier against arcing between the terminals extending through the heat radiator and at least one projection projects upward from the second heat radiator between an emitter terminal extending through the second heat radiator and a collector terminal extending through the second heat radiator with the at least one projection radiating heat and providing a barrier against arcing between the terminals extending through the second heat radiator.

The thermally and electrically conductive emitter contact plate has a first surface contacting the emitter contact and a second surface electrically contacting the emitter terminal and thermally contacting the second heat radiator with the emitter terminal extending through an aperture in the second heat radiator and a hermetic seal between the second surface and the second heat radiator and a collector contact plate which is hermetically sealed to the second heat radiator and which contacts the collector terminal extending through the second heat radiator.

While the preferred embodiment of the present invention is a IGBT assembly, it should be understood that the present invention may also be practiced in other power semiconductor switches, such as without limitation metal oxide semiconductor field effect transistors (MOSFETs) and metal oxide semiconductor controlled thyristors (MCTs).

A power semiconductor switch assembly in accordance with the invention includes a power switch semiconductor die having a plurality of electrodes and first and second opposed surfaces; a heat conductive electrically insulative substrate thermally coupled to the first surface for conducting heat away from the first surface of the die and having conductors for conducting electric current between a control electrode and a control terminal and a first power electrode and a first power electrode terminal of the assembly; a first heat radiator thermally coupled to the substrate for radiating heat flowing from the first surface of the die through the heat conductive insulative substrate; a heat conductive insulator having first and second surfaces with the first surface being thermally coupled to the second surface of the die and at least one aperture aligned with a second power electrode of the die; a second power electrode contact disposed on the second surface of the insulator having at least one spring contact extending through at least one aperture of the insulator for conducting electric current between the second power electrode and a second power electrode terminal of the assembly; and a second heat radiator which is electrically insulative and thermally coupled to the second power electrode contact for radiating heat flowing from the second surface of the die through the second power electrode contact. The power semiconductor switch assembly further includes a thermally and electrically conductive second power electrode contact plate having a first surface electrically and thermally contacting the second power electrode contact and a second surface electrically and thermally contacting the second power electrode terminal and thermally contacting the second heat radiator with the second power electrode terminal extending through an aperture in the second heat radiator. The power semiconductor switch assembly further include a first power electrode contact spring electrically coupled to the conductor of the heat conductive electrically insulative substrate through which current flows between the first power electrode and the first power electrode terminal and the first power electrode terminal which extends through an aperture in the second heat radiator. The power semiconductor switch assembly further includes a first power electrode contact spring electrically coupled to the conductor of the heat conductive electrically insulative substrate through which current flows between the first power electrode and the first power electrode terminal that is electrically coupled to a first power electrode contact plate which contacts the first power electrode terminal extending through the second heat radiator.

A seal ring is joined to the first heat radiator and the second heat radiator which forms a hermetic seal and which loads the first and second surfaces of the die in compression to promote heat flow from the first and second surfaces of the die respectively to the first and second heat radiators. The seal ring includes a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

The invention further includes a control electrode terminal extending through an aperture in the second heat radiator to the conductor for conducting electric current between the control electrode and the control electrode terminal; and a second power electrode sense terminal extending through an aperture in the second heat radiator into electrical contact with the second power electrode contact.

At least one projection projects upward from the second heat radiator between a second power electrode terminal extending through the second heat radiator and a control electrode terminal extending through the heat radiator with at least one projection radiating heat and providing a barrier against arcing between the terminals extending through the second heat radiator and at least one projection projecting upward from the second heat radiator between a second power electrode terminal extending through the second heat radiator and a first power electrode terminal extending through the second heat radiator with at least one projection radiating heat and providing a barrier against arcing between the terminals extending through the second heat radiator.

The invention further includes a thermally and electrically conductive second power electrode contact plate having a first surface electrically and thermally contacting the second power electrode contact and a second surface electrically and thermally contacting the second power electrode terminal and thermally contacting the second heat radiator with the second power electrode terminal extending through an aperture in the second heat radiator and a hermetic seal between the second surface and the second heat radiator; a first power electrode contact spring electrically coupled to the conductor of the heat conductive electrically insulative substrate through which current flows between the first power electrode and a first power electrode terminal which extends through an aperture in the second heat radiator and a first power electrode contact plate which is hermetically sealed to the second heat radiator and which contacts the first power electrode terminal extending through the second heat radiator.

BEST MODE FOR CARRYING OUT THE INVENTION

Figure 1:
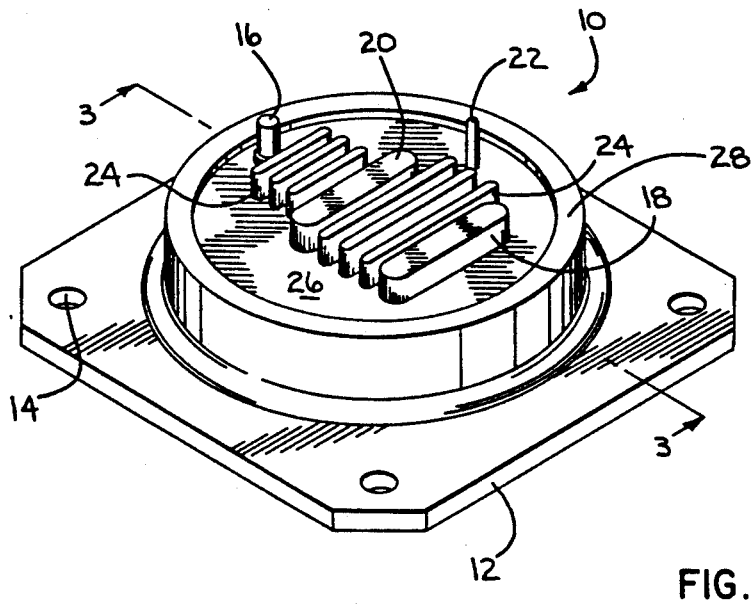
FIG. 1 illustrates an isometric view of a IGBT assembly in accordance with the present invention.

The present invention provides an improved power semiconductor switch assembly having a high rate of heat dissipation through bottom and top surfaces of the assembly which maintains electrical continuity between external electrode terminals extending into the assembly and electrodes of a power semiconductor die during thermal cycling of the assembly caused by operation. The invention preferably is used in an IGBT assembly but may also be used in a MOSFET, a MCT or other types of power switch assemblies. The preferred embodiment of the invention illustrated in FIGS. 1-8 in which like reference numerals identify like parts is an IGBT. However, it should be understood that the heat radiating capabilities and thermal and electrical connections between external terminals extending through the housing to electrodes within the semiconductor die and between heat radiators and heat radiating surfaces of the semiconductor die may be utilized in other power switch assemblies.

FIG. 1 illustrates an isometric view of a IGBT assembly 10 in accordance with the present invention. The assembly includes a mounting plate 12 which is attached to a mount (not illustrated) by fasteners secured to the mount through holes 14 in the mounting plate. The mounting plate 12 is electrically insulated from the external terminals 16–22 of the assembly 10 which are electrically connected to electrodes of a semiconductor die partially contained within the assembly. The terminals include a control terminal 16 which is a gate terminal when the present invention is practiced with a IGBT, a first power terminal which is a collector terminal when the present invention is practiced with IGBT, a second power terminal 20 which is an emitter terminal when the present invention is practiced with a IGBT and a control terminal sense pin 22 which provides a return path for current flowing to the gate terminal when the present invention is practiced with a IGBT. Additionally, a plurality of heat radiating fins 24 extend upward from a top surface 26 which is the outside surface of a second heat radiator as described below. The fins 24 perform the dual function of dissipating heat which is conducted upward from a top surface of the semiconductor die contained within the assembly 10 and further provide a barrier against arcing or current flow between the terminals extending through the heat radiator. The raised fins 24 prevent the formation of a low resistance path between terminals which are maintained at different potentials. The terminals 16–22 are preferably manufactured from a high conductivity metal, such as copper and/or aluminum. The mounting plate 12 also functions as a first heat radiator which is described below. Heat produced by operation of the semiconductor die within the assembly 10 flows downward from a lower surface of the semiconductor die to the mounting plate 12. The conduction of heat from top and bottom surfaces of the assembly is an improvement over the prior art IGBT assemblies which use only heat conduction to the mounting plate to dissipate heat caused by switching of the semiconductor die. A seal ring 28 forms a hermetic seal between a first radiator and a second radiator which includes the top surface 26. The seal ring 28 is described below in detail.

Figure 3:
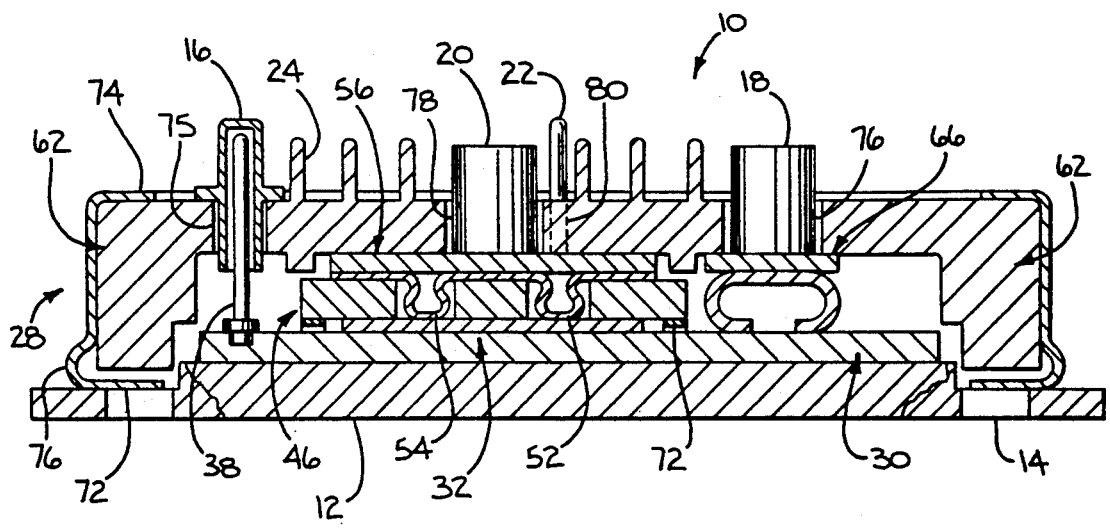
FIG. 3 illustrates a sectional view of the IGBT assembly of FIG. 1 along section lines 3—3.
Figure 2:
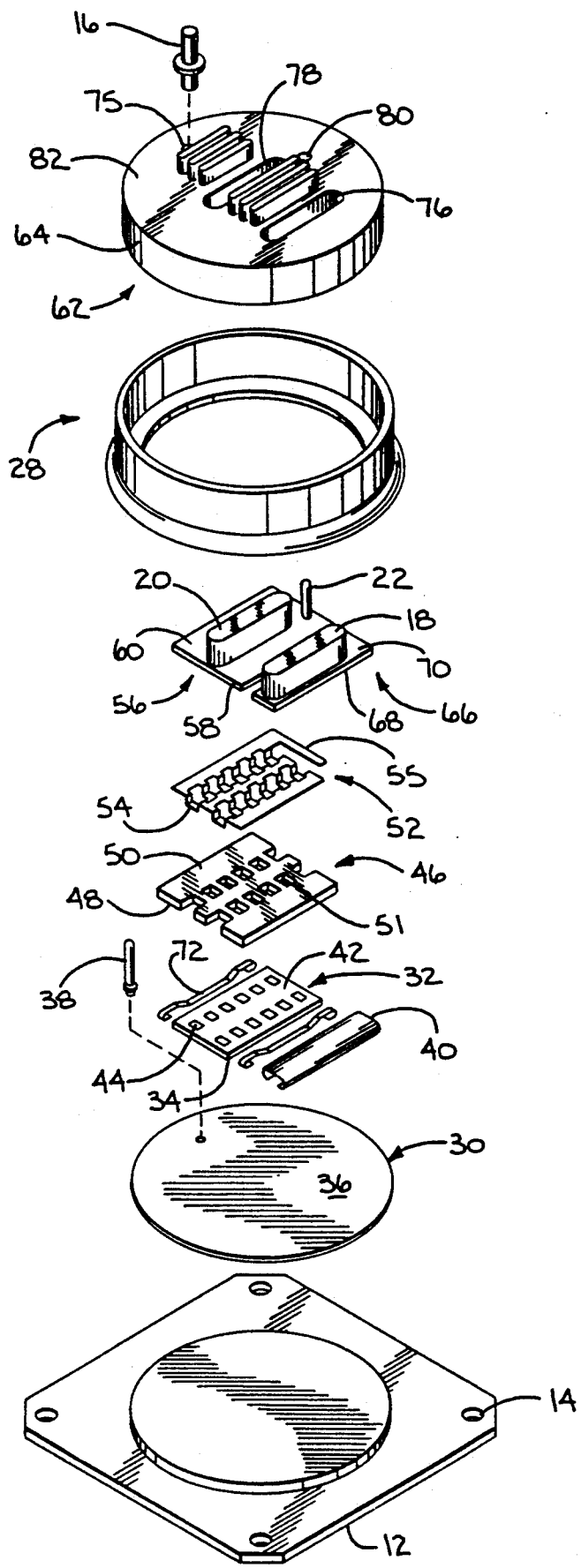
FIG. 2 illustrates an exploded view of the IGBT of FIG. 1.
Figure 4:
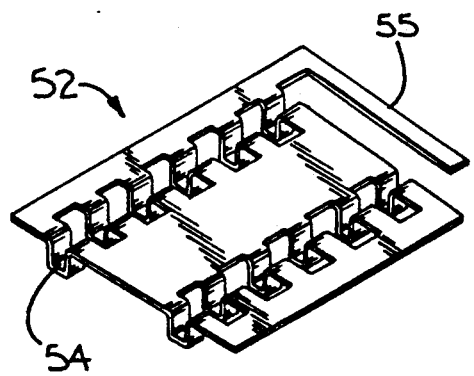
FIG. 4 illustrates an enlarged isometric view of the emitter contact illustrated in FIG. 2.

FIGS. 2-4 illustrate respectively an exploded view of the assembly of FIG. 1, a sectional view of FIG. 1 taken along section lines 3—3 and an enlarged isometric view of an emitter contact. The mounting plate 12 is electrically conductive and is preferably manufactured from a metallic alloy, such as a mixture of copper and molybdenum which has a coefficient of thermal expansion (CTE) which is matched to a heat conductive electrically insulative substrate 30 which is disposed between the mounting plate 12 and a IGBT semiconductor die 32 which may be of any known configuration. The heat conductive electrically insulative substrate 30 is preferably beryllium oxide which is highly insulative and further has a high thermal conductivity for conducting heat from a first surface 34 of the IGBT die 32. Beryllium oxide also has a CTE which closely matches the CTE of the silicon used in forming the IGBT die 32 to prevent stress related failures caused by dissimilar matching CTEs between the first surface of the IGBT die and a top surface 36 of the heat conductive electrically insulative substrate. Conductors are disposed on the top surface 36 for conducting electric current between the gate electrode and the gate terminal 16 through a conductive pin 38 which is joined to the gate terminal and to metallization on the top surface of the substrate and a conductor for conducting electric current between the collector electrode on the bottom side of the die 32 and the collector terminal 18 through metallization on the top surface of the substrate and the collector contact spring 40. The metallizations on the top surface 36 of the heat conductive electrically insulative substrate 30 which respectively connect the gate terminals 16 and the collector terminal 18 to the gate electrode and the collector electrode of the semiconductor die 32 are conventional. The metallization on the top surface 36 of the heat conductive electrically insulative substrate 30 extending between the pin 38 and the gate electrode of the IGBT die 32 is discussed below with reference to FIGS. 5 and 6. The metallization on the top surface 36 of the heat conductive electrically insulative substrate 30 extending between the collector contact spring 40 and the collector electrodes of the IGBT die 32 extends from the point of contact of the spring to the bottom surface 34 of the die which is the collector. A top surface 42 of the IGBT die 32 includes a plurality of emitter electrodes 44. The emitters 44 are referred to as the emitter electrode and it should be understood that one or more emitter electrodes are contemplated with the practicing of the present invention using the IGBT die 32. A heat conductive electrical insulator 46 has a first surface 48 which contacts the top surface 42 of the IGBT die 32 and a top surface 50 which contacts an emitter contact 52. The heat conductive insulator 46 is thermally coupled to the top surface 42 of the IGBT die 32. The heat conductive electrical insulator 46 contains a plurality of apertures 52 which are aligned with the emitter electrodes 44 of the IGBT die 32. The heat conductive insulator 46 is preferably formed from beryllium oxide which provides a high thermal conductivity for conducting heat upward from the top surface 42 of the IGBT die 32, high electrical insulation and a CTE which matches the CTE of the silicon from which the IGBT die 32 is formed to avoid stress related failures. The emitter contact 52 is disposed on the top surface 50 of the heat conductive insulator 46 and has a plurality of spring contacts 54 which extend through the apertures 51 to make electrical contact with the emitter electrodes 44 and with the emitter terminal 20. The spring contacts 54 are elastically deformed when the assembly 10 is completed to provide a spring bias which urges the contacts into surface contact with the emitter electrodes 44 to maintain high electrical continuity even in the presence of stress caused by thermal cycling. The contacts 54 eliminate the prior art problem of failure caused by wire bonding in the emitter circuit to complete the electrical path between the external emitter terminal and the emitter electrodes of the prior art. It should be understood that the spring contacts 54 may be varied in shape with the only important consideration being that the final assembly causes a spring bias of the contacts against the emitter electrodes 44 to maintain high electrical conductivity. The tang 55 is aligned with the emitter sense terminal 22 to provide a return path for the gate current. Preferably, the emitter contact 20 is formed from a metallic conductor having a CTE which is matched with the CTE of the emitter electrodes 44 of the IGBT die 32. An emitter contact plate 56 is attached to the emitter terminal 20 and the emitter sense terminal 22 and is electrically connected thereto. The thermally and electrically conductive emitter contact plate 56 has a first surface 58 electrically and thermally contacting the emitter contact 52 and a second surface 60 thermally contacting a second heat radiator 62. The second surface 60 is hermetically sealed to a bottom surface 64 of the second heat radiator 62. A collector contact plate 66 has a first surface 68 which is electrically and thermally coupled to the collector spring 40 and a second surface 70 which is hermetically sealed to the bottom surface 64 of the second heat radiator 62. The seal ring 28 is joined to the first heat radiator which is embodied in the mounting plate 12 and the second heat radiator 62. The seal ring 28 forms a hermetic seal to hermetically seal the heat conductive electrically insulative substrate 30, the IGBT die 32, the heat conductive insulator 46, the emitter contact 52 and support springs 72 which support the overhang of the spreader 46 over the IGBT die 32. The seal ring loads the surfaces 34 and 42 of the IGBT die 32 in compression to promote heat flow from the first and second surfaces of the die respectively to the first and second heat radiators 12 and 62. The seal ring 28 has a first end 72 having a section which extends radially inward from an outside diameter of the second radiator 62 and is joined to the first radiator 12, a second end 74 having a section which extends radially inward from the outside diameter of the second radiator and is joined to the second heat radiator and a thermal expansion joint 76 contained within the ring. The thermal expansion joint 76 may be a crimped or bent section of metal to provide necessary stress relief caused by thermal expansion of the thickness of the assembly 10. The first heat radiator 62 may be manufactured from thermally conductive electrically insulative materials such as, but not limited to, aluminum oxide ($Al_2O_3$) or other similar, inexpensive, easily formed materials. The terminals 16–22 are preferably formed from highly conductive metals, such as copper, to permit the carrying of high current. It should be noted that the physical length between the emitter terminal 20 and the emitter electrodes 44 has been reduced by eliminating the wire bond of the prior art. Additionally, a larger cross-sectional surface area is provided for conducting emitter current which provides additional protection against fusing (melting) as with the emitter wire bond in the prior art which causes failure. Furthermore, it should be noted that while beryllium oxide is a preferred heat conductive electrically insulative substrate 30, the invention may be further practiced with aluminum nitride (AlN) for implementing the substrate 30 and the insulator. The connections which are used for forming the final assembly utilize melted metal, such as brazing or soldering, between surfaces which are joined especially when a hermetic seal is to be maintained. The contact plates 56 and 66 are brazed to the underside 64 of the second heat radiator 62 which is preferably formed from molded and sintered alumina ($AL_2O_3$) to provide a hermetic seal between the outside of the assembly and the IGBT die 32 within the assembly. The terminals 16–22 extend through apertures 74–80 extending through the second heat radiator 62 which are aligned respectively with the gate terminal 16, collector terminal 18, emitter terminal 20 and emitter sensed terminal 22. As a consequence of the high CTE of the terminals 16–22, it is necessary to space the apertures 74–80 from surface contact with the terminals. As a result, the hermetic seal must be formed by joining the underlying contact plates 56 and 66 to the bottom surface 64.

When a hermetic seal is formed, two solder preforms are installed respectively above and below the IGBT die 32. The heat spreader 46 is used to both properly align and to hold the IGBT die in place. A third solder perform is located on top of the collector spring contact 40. The completed cover assembly is aligned to the top side 50 of the insulator 46 and the gate pin 38 within the aperture 74. The emitter spring contacts 54 fit through the apertures 51 of the insulator 46. When the top of the assembly is lowered, the solder preform contacts the emitter of the IGBT die 32. The assembly is placed in an inert or dry $N_2$ chamber. Pressure is applied to the cover, such that compression is applied to all of the connection points so that electrical testing may be performed to determine that proper electrical continuity exists. With the pressure still applied, the section 74 is rolled down onto a solder preform on the top surface 82 of the second heat radiator 62 to preform the cover. Heat is applied to melt the solder preforms contained within the assembly.

Figure 5:
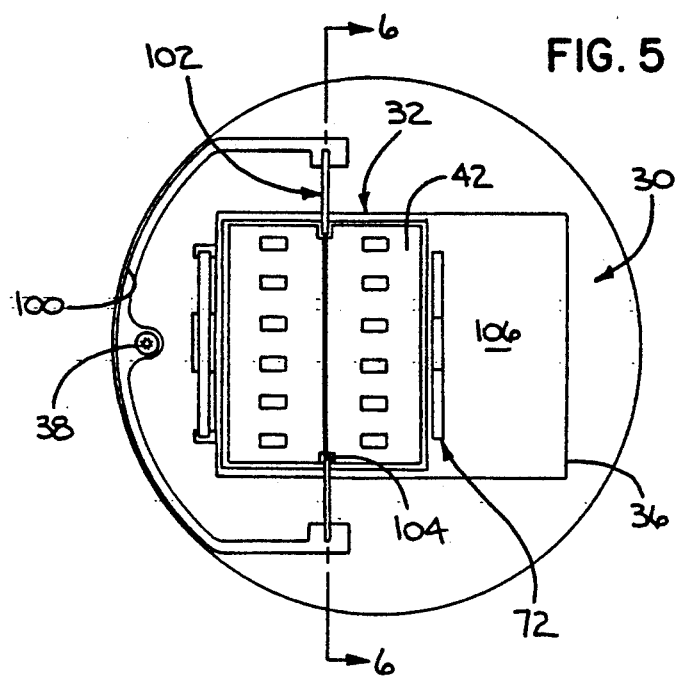
FIG. 5 illustrates a top plan view of the electrical connection between the gate electrode and the IGBT semiconductor die.
Figure 6:
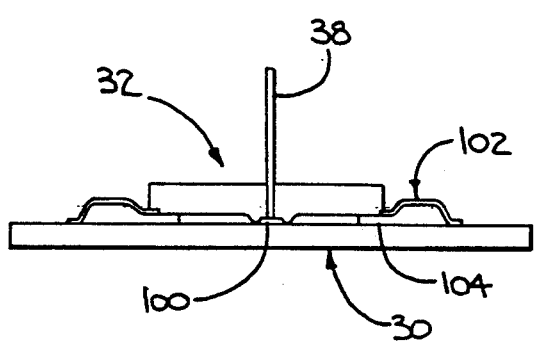
FIG. 6 is a sectional view of FIG. 5 taken along section line 6—6.
Figure 7:
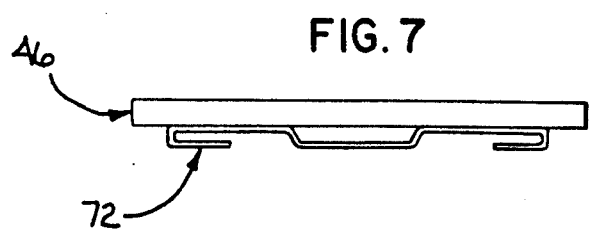
FIG. 7 illustrates a sub assembly of the insulator and support springs which contact the heat conductive insulative substrate on which the semiconductor die is disposed.

FIG. 5 illustrates a plan view of the connection of the gate metallization disposed on the top surface 36 of the heat conductive electrically insulative substrate 30. The gate electrode metallization 100 is electrically connected to the conductive pin 38 and to wire bonds 102 which are connected to the gate electrode 104. The metallization for connecting the collector contact spring 40 to the collector is contained within area 106 of the heat conductive electrically insulative substrate 30. FIG. 6 illustrates a sectional view of FIG. 5 taken along section lines 6—6. FIG. 7 illustrates a sub-assembly of the heat conductive insulator 46 and a support spring 72 which supports the portion of the spreader 46 which extends outward over the IGBT die 32.

Figure 8A:
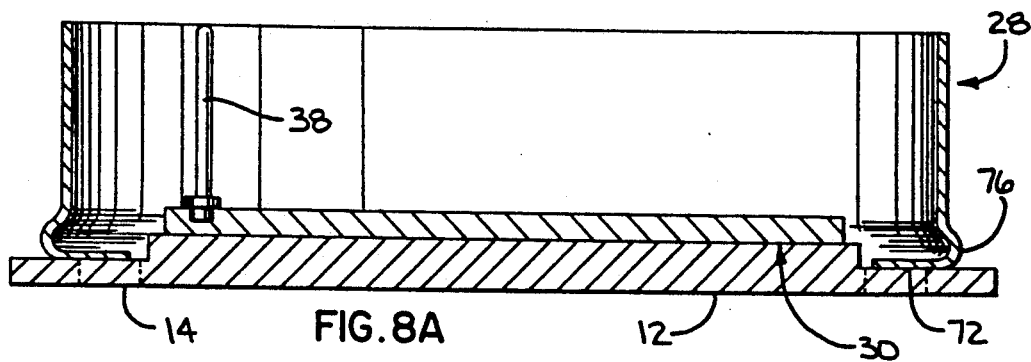
FIGS. 8A-8D illustrate an assembly sequence for forming a semiconductor assembly in accordance with FIGS. 1-3.
Figure 8B:
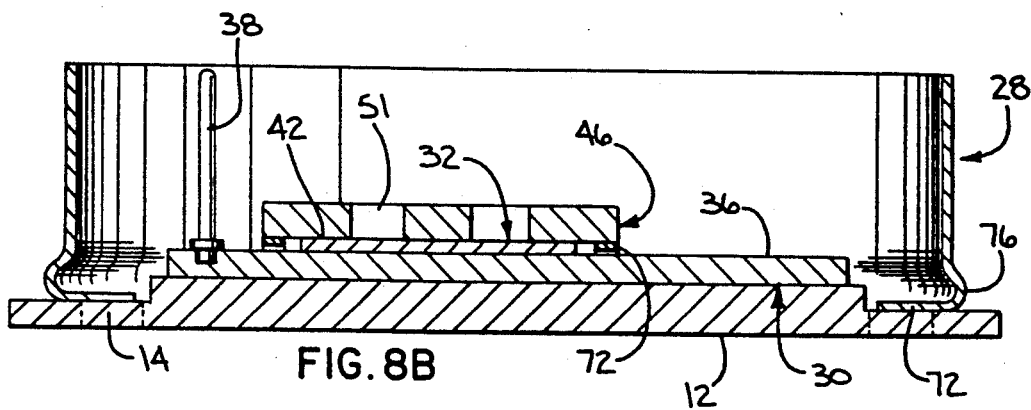
Figure 8C:
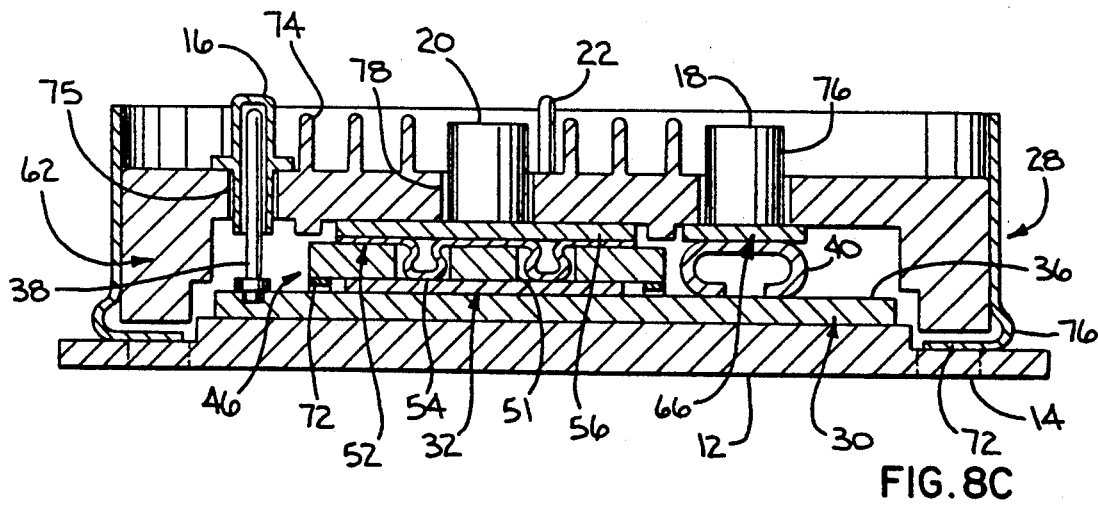
Figure 8D:
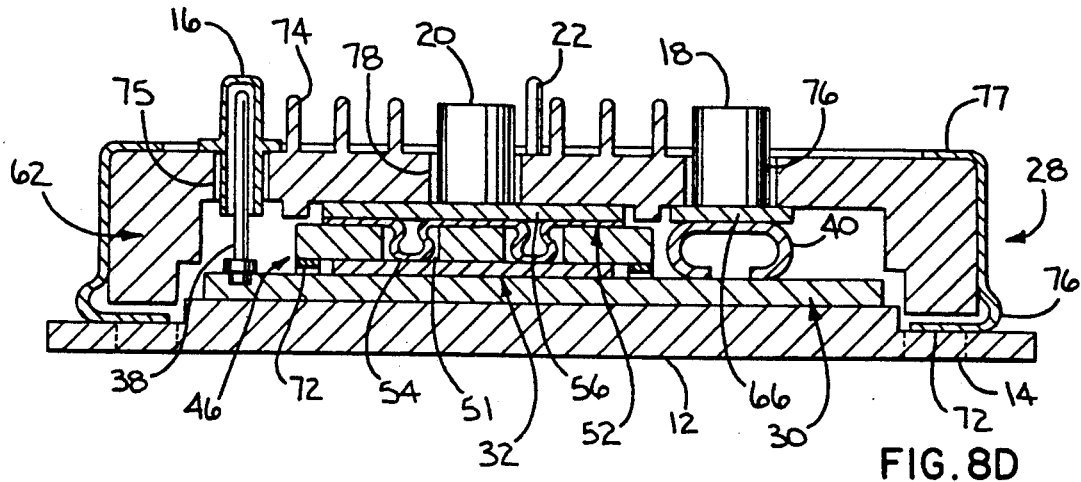

FIGS. 8A–8D illustrate successive stages in the assembly of an IGBT assembly in accordance with the present invention. FIG. 8A illustrates the assembly of the mounting plate 12, heat conductive electrically insulative substrate 30 and the seal ring 28 with the conductive pin 38 in place in the substrate for providing a conductive path between the gate terminal and the gate electrode. FIG. 8B illustrates the placement of the IGBT die 32 on the top surface 36 of the substrate 30 and the placement of the heat conductive insulator 46 on the top surface 42 of the IGBT die 32. FIG. 8C illustrates the placement of the emitter contact 52 including spring contacts 54 within the apertures 51 of the heat conductive insulator 46, the placement of the collector contact spring 40 on the top surface 36 of the substrate, the placement of the emitter contact plate 56 on the top surface of the emitter contact 52 and the collector contact plate 66 on the top surface of the collector spring 40, the placement of the second heat radiator 62 on top of the emitter contact plate 56 and the collector contact plate 66 and the gate terminal 16 on top of the conductive pin 38. FIG. 8D illustrates the final assembly with the top section 74 rolled over and joined to the second heat radiator 62 and thermally cured to form final metal bonds of solder or brazing to hermetically seal the assembly.

While the invention has been described in terms of its preferred embodiments, it should be understood that numerous modifications may be made thereto without departing from the spirit and scope of the invention as defined in the appended claims. As has been discussed above, the present invention while preferably being used in conjunction with IGBTs is useful for other types of power semiconductor switches.

I claim:

1. An insulated gate bipolar transistor assembly comprising:
    an insulated gate bipolar transistor die having gate, at least one emitter and collector electrodes and first and second opposed surfaces;
    a heat conductive electrically insulative substrate thermally coupled to the first surface for conducting heat away from the first surface of the die and having conductors for conducting electric current between the gate electrode and a gate terminal and a collector electrode and a collector terminal of the assembly;
    a first heat radiator thermally coupled to the substrate for radiating heat flowing from the first surface of the die through the heat conductive insulative substrate;
    a heat conductive electrical insulator having first and second surfaces with the first surface being thermally coupled to the second surface of the die and a plurality of apertures aligned with the emitter electrode of the die;
    an emitter contact disposed on the second surface of the insulator having a plurality of spring contacts extending through the apertures of the insulator for conducting electric current between the emitter electrode and an emitter terminal of the assembly; and
    a second heat radiator which is electrically insulative and thermally coupled to the emitter contact for radiating heat flowing from the second surface of the die through the emitter contact.

2. An insulated gate bipolar transistor assembly in accordance with claim 1 further comprising:
    a thermally and electrically conductive emitter contact plate having a first surface electrically and thermally contacting the emitter contact and a second surface electrically and thermally contacting the emitter terminal and thermally contacting the second heat radiator with the emitter terminal extending through an aperture in the second heat radiator.

3. An insulated gate bipolar transistor assembly in accordance with claim 1 further comprising:
    a collector contact spring electrically coupled to the conductor of the heat conductive electrically insulative substrate through which current flows between the collector electrode and the collector terminal and electrically coupled to the collector terminal which extends through an aperture in the second heat radiator.

4. An insulated gate bipolar transistor assembly in accordance with claim 2 further comprising:
    a collector contact spring electrically coupled to a conductor of the heat conductive electrically insulative substrate through which current flows between the collector electrode and the collector terminal and electrically coupled to a collector contact plate which contacts the collector terminal extending through the second heat radiator.

5. An insulated gate bipolar transistor assembly in accordance with claim 1 further comprising:
    a seal ring joined to the first heat radiator and the second heat radiator which forms a hermetic seal and which loads the first and second surfaces of the die in compression to promote heat flow from the first and second surfaces of the die respectively to the first and second heat radiators.

6. An insulated gate bipolar transistor assembly in accordance with claim 5 wherein the seal ring comprises:
    a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

7. An insulated gate bipolar transistor assembly in accordance with claim 2 further comprising:
    a seal ring joined to the first heat radiator and the second heat radiator which forms a hermetic seal and which loads the first and second surfaces of the die in compression to promote heat flow from the first and second surfaces of the die respectively to the first and second heat radiators.

8. An insulated gate bipolar transistor assembly in accordance with claim 7 wherein the seal ring comprises:
    a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

9. An insulated gate bipolar transistor assembly in accordance with claim 3 further comprising:

a seal ring joined to the first heat radiator and the second heat radiator which forms a hermetic seal and which loads the first and second surfaces of the die in compression to promote heat flow from the first and second surfaces of the die respectively to the first and second heat radiators.

10. An insulated gate bipolar transistor assembly in accordance with claim 9 wherein the seal ring comprises:

a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

11. An insulated gate bipolar transistor assembly in accordance with claim 4 further comprising:

a seal ring joined to the first heat radiator and the second heat radiator which forms a hermetic seal and which loads the first and second surfaces of the die in compression to promote heat flow from the first and second surfaces of the die respectively to the first and second heat radiators.

12. An insulated gate bipolar transistor assembly in accordance with claim 11 wherein the seal ring comprises:

a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

13. An insulated gate bipolar transistor assembly in accordance with claim 2 further comprising:

a gate terminal extending through an aperture in the second heat radiator to the conductor for conducting electric current between the gate electrode and the gate terminal; and an emitter sense terminal extending through an aperture in the second heat radiator into electrical contact with the emitter contact.

14. An insulated gate bipolar transistor assembly in accordance with claim 1 further comprising:

at least one projection projecting upward from the second heat radiator between an emitter terminal extending through the second heat radiator and a gate terminal extending through the second heat radiator with the at least one projection radiating heat and providing a barrier against arcing between the terminals extending through the second heat radiator.

15. An insulated gate bipolar transistor assembly in accordance with claim 1 further comprising:

at least one projection projecting upward from the second heat radiator between an emitter terminal extending through the second heat radiator and a collector terminal extending through the second heat radiator with the at least one projection radiating heat and providing a barrier against arcing between the terminals extending through the second heat radiator.

16. An insulated gate bipolar transistor assembly in accordance with claim 5 further comprising:

a thermally and electrically conductive emitter contact plate having a first surface contacting the emitter contact and a second surface electrically contacting the emitter terminal and thermally contacting the second heat radiator with the emitter terminal extending through an aperture in the second heat radiator and a hermetic seal between the second surface and the second heat radiator;

a collector contact spring electrically coupled to the conductor of the heat conductive electrically insulative substrate through which current flows between the collector electrode and a collector terminal that is electrically coupled to the collector terminal which extends through an aperture in the second heat radiator; and a collector contact plate which is hermetically sealed to the second surface of the second heat radiator and which contacts the collector terminal extending through the second heat radiator.

17. A power semiconductor switch assembly comprising:

a power switch semiconductor die having a plurality of electrodes and first and second opposed surfaces;

a heat conductive electrically insulative substrate thermally coupled to the first surface for conducting heat away from the first surface of the die and having conductors for conducting electric current between a control electrode and a control terminal and a first power electrode and a first power electrode terminal of the assembly;

a first heat radiator thermally coupled to the substrate for radiating heat flowing from the first surface of the die through the heat conductive insulative substrate;

a heat conductive electrical insulator having first and second surfaces with the first surface being thermally coupled to the second surface of the die and at least one aperture aligned with a second power electrode of the die;

a second power electrode contact disposed on the second surface of the insulator having at least one spring contact extending through said at least one aperture of the insulator for conducting electric current between the second power electrode and a second power electrode terminal of the assembly; and a second heat radiator which is electrically insulative and thermally coupled to the second power electrode contact for radiating heat flowing from the second surface of the die through the second power electrode contact.

18. A power semiconductor switch assembly in accordance with claim 17 further comprising:

a thermally and electrically conductive second power electrode contact plate having a first surface electrically and thermally contacting the second power electrode contact and a second surface electrically and thermally contacting the second power electrode terminal and thermally contacting the second heat radiator with the second power electrode terminal extending through an aperture in the second heat radiator.

19. A power semiconductor switch assembly in accordance with claim 17 further comprising:

a first power electrode contact spring electrically coupled to the conductor of the heat conductive electrically insulative substrate through which current flows between the first power electrode and the first power electrode terminal that is electrically coupled to the first power electrode terminal which extends through an aperture in the second heat radiator.

20. A power semiconductor switch assembly in accordance with claim 18 further comprising:
a first power electrode contact spring electrically coupled to the conductor of the heat conductive electrically insulative substrate through which current flows between the first power electrode and the first power electrode terminal that is electrically coupled to a first power electrode contact plate which contacts the first power electrode terminal extending through the second heat radiator.

21. A power semiconductor switch assembly in accordance with claim 17 further comprising:
a seal ring joined to the first heat radiator and the second heat radiator which forms a hermetic seal and which loads the first and second surfaces of the die in compression to promote heat flow from the first and second surfaces of the die respectively to the first and second heat radiators.

22. A power semiconductor switch assembly in accordance with claim 21 wherein the seal ring comprises:
a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

23. A power semiconductor switch assembly in accordance with claim 18 further comprising:
a seal ring joined to the first heat radiator and the second heat radiator which forms a hermetic seal and which loads the first and second surfaces of the die in compression to promote heat flow from the first and second surfaces of the die respectively to the first and second heat radiators.

24. A power semiconductor switch assembly in accordance with claim 23 wherein the seal ring comprises:
a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

25. A power semiconductor switch assembly in accordance with claim 19 further comprising:
a seal ring joined to the first heat radiator and the second heat radiator which forms a hermetic seal and which loads the first and second surfaces of the die in compression to promote heat flow from the first and second surfaces of the die respectively to the first and second heat radiators.

26. A power semiconductor switch assembly in accordance with claim 25 wherein the seal ring comprises:
a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

27. A power semiconductor switch assembly in accordance with claim 20 further comprising:
a seal ring joined to the first heat radiator and the second heat radiator which forms a hermetic seal and which loads the first and second surfaces of the die in compression to promote heat flow from the first and second surfaces of the die respectively to the first and second heat radiators.

28. A power semiconductor switch assembly in accordance with claim 27 wherein the seal ring comprises:
a first end having a section which extends radially inward from an outside diameter of the second radiator and is joined to the first radiator, a second end having a section which extends radially inward from the outside diameter of the second heat radiator and is joined to the second heat radiator and a thermal expansion joint contained within the ring.

29. A power semiconductor switch assembly in accordance with claim 18 further comprising:
a control electrode extending through an aperture in the second heat radiator to the conductor for conducting electric current between the control electrode and the control electrode terminal; and
a second power electrode sense terminal extending through an aperture in the second heat radiator into electrical contact with the second power electrode contact.

30. A power switch semiconductor assembly in accordance with claim 17 further comprising:
at least one projection projecting upward from the second heat radiator between a second power electrode terminal extending through the second heat radiator and a control electrode terminal extending through the second heat radiator with the at least one projection radiating heat and providing a barrier against arcing between the terminals extending through the second heat radiator.

31. A power switch semiconductor assembly in accordance with claim 17 further comprising:
at least one projection projecting upward from the second heat radiator between a second power electrode terminal extending through the second heat radiator and a first power electrode terminal extending through the second heat radiator with the at least one projection radiating heat and providing a barrier against arcing between the terminals extending through the second heat radiator.

32. A power switch semiconductor assembly in accordance with claim 22 further comprising:
a thermally and electrically conductive second power electrode contact plate having a first surface contacting the second power electrode contact and a second surface electrically contacting the second power electrode terminal and thermally contacting the second heat radiator with the second power electrode terminal extending through an aperture in the second heat radiator and a hermetic seal between the second surface and the second heat radiator;
a first power electrode contact spring electrically coupled to the conductor of the heat conductive electrically insulative substrate through which current flows between the first power electrode and a first power electrode terminal that is electrically coupled to the first power electrical terminal which extends through an aperture in the second heat radiator; and
a first power electrode contact plate which is hermetically sealed to the second surface of the second heat radiator and which contacts the first power electrode terminal extending through the second heat radiator.

* * * * *